United States Patent
Master et al.

(10) Patent No.: US 6,409,070 B1
(45) Date of Patent: Jun. 25, 2002

(54) MINIMIZING FLUX RESIDUE BY CONTROLLING AMOUNT OF MOISTURE DURING REFLOW

(75) Inventors: Raj N. Master; Mohammad Z. Khan; Maria G. Guardado, all of San Jose, CA (US); Diong Hing Ding; Junaida Abu Bakar, both of Penag (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/663,939

(22) Filed: Sep. 18, 2000

Related U.S. Application Data

(60) Provisional application No. 60/214,780, filed on Jun. 28, 2000.

(51) Int. Cl.[7] .............................................. B23K 31/02
(52) U.S. Cl. ...................................... 228/102; 228/219
(58) Field of Search ................................ 228/102, 103, 228/180.1, 180.21, 220, 219, 6.2; 432/26, 197, 198

(56) References Cited

U.S. PATENT DOCUMENTS

| | | | | |
|---|---|---|---|---|
| 2,085,587 A | * | 6/1937 | Hotchkiss | |
| 4,294,395 A | * | 10/1981 | Nayar | |
| 4,568,277 A | * | 2/1986 | MacInnes et al. | |
| 4,580,716 A | * | 4/1986 | Barresi et al. | |
| 4,855,007 A | * | 8/1989 | Baxter et al. | |
| 5,085,364 A | * | 2/1992 | Ishikawa et al. | |
| 5,531,372 A | * | 7/1996 | Bonner et al. | |
| 6,238,487 B1 | * | 5/2001 | Jenkins et al. | |

* cited by examiner

*Primary Examiner*—Tom Dunn
*Assistant Examiner*—Jonathan Johnson

(57) ABSTRACT

A method of manufacturing a flip-chip semiconductor device by attaching a semiconductor die to a substrate using solder comprises the steps of applying a no-clean flux to the semiconductor die and the substrate; heating the solder and the flux in a furnace to bond the semiconductor die to the substrate; and underfilling between the semiconductor die and the substrate. While the solder and flux is being heated, a reducing atmosphere in the furnace is being measured to determine the moisture content. When the moisture content exceeds a threshold amount, a signal will be provided. A reflow furnace for practicing the method is also disclosed.

14 Claims, 4 Drawing Sheets

MINIMIZING FLUX RESIDUE BY CONTROLLING AMOUNT OF MOISTURE DURING REFLOW

RELATED APPLICATIONS

This application claims priority from U.S. Provisional Application Ser. No. 60/214,780, filed Jun. 28, 2000, incorporated herein by reference.

FIELD OF THE INVENTION

The present invention relates to the manufacturing of semiconductor devices, and more particularly, to reflow processes that generate flux residue.

BACKGROUND OF THE INVENTION

An increasingly important aspect of manufacturing an integrated circuit chip, also referred to as an integrated circuit die or semiconductor die, is the mounting of the die to a substrate. Often times, the goal of this process is to provide the chip with as many input/output ("I/O") terminals as possible. Because of its capability to provide high I/O density, flip-chip bonding is one of the various surface mounting techniques being used in the semiconductor industry. In addition, flip-chips provide small profiles and good electrical performance.

In the flip-chip bonding process, the die is mounted directly to the substrate. A representation of a flip-chip 10 is illustrated in FIG. 1. Generally, the flip-chip process entails disposing a plurality of solder bumps 12 on the upper surface 14 of the die 16, flipping the die 16 and mating these solder bumps 12 with corresponding bonding pads 18 located on the substrate 20. The combination of the die 16 and substrate 20 is then heated so as to reflow the solder bumps 12. Once reflowed, each bump 12 forms a bond between the die 16 and the substrate 20, with the bond functioning as both an electrical and a physical connection.

The metallized surfaces to be bonded are typically heavily contaminated with metal oxides, carbon compounds, and other materials due to extended exposure in the manufacturing environment and therefore require cleaning prior to bonding as a metallized surface contaminated by these materials is difficult to be wetted by solder. However, once this surface contamination is removed, the solder can wet the metallized surface and form a metallurgically sound solder joint, which will both hold the various electronic components in place and pass electrical signals.

These contaminants are typically removed from the metallized surfaces by the application of fluxes. A typical flux consists of active agents dissolved or dispensed in a liquid carrier, such as a flux paste. The carrier for flux is typically alcohol-based, with varying concentrations of acids or salts as activators. The function of the activators is to reduce base metal oxides. The flux has a variety of purposes, which include removing oxides from the metallization; removing oxides on the molten solder to reduce the surface tension and enhance flow; inhibiting subsequent oxidation of the clean metal surfaces during soldering; and assisting in the transfer of heat to the joint during soldering.

Depending upon the type of flux paste, a flux residue remains after reflow welding during which the solder joint is formed. The residue comprises a carrier, such as rosin or resin that is not evaporated, acid or salt deposits, and the removed oxides. If not removed, this residue can be detrimental to the long-term reliability of an electronic package. The resin can also absorb water and become an ionic conductor, which could result in electrical shorting and corrosion. Additionally, the residual activator can, over a period of time, corrode the soldered components and cause electrical opens.

If fluxes that leave corrosive and/or hygroscopic residues are used, post-soldering cleaning using chlorinated fluorocarbons (CFCs), organic solvents, semi-aqueous solutions, or water is required. For this type of process, in addition to volatile organic compound emissions from the soldering process, the cleaning process results in emission of CFCs and waste water. These emissions detrimentally add to environmental pollution and production costs.

A type of flux that advantageously does not require cleaning is commonly referred to as a no-clean flux. This type of flux is designed to leave little or no residue, thereby negating the need to clean the semiconductor device after reflow welding. No-clean fluxes were originally intended for such operations as board mounting in cell phones, motherboards, or PCs for which the main concern of the manufacturer was leakage. Also, the flux was designed so that even if a residue remained, the residue would not be detrimental to the long-term reliability of the semiconductor device. However, this residue can cause a problem during a process known as underfilling.

Underfilling has been used to solve a problem in flip-chip mounting caused by a mismatch commonly found between the coefficient of thermal expansion of the semiconductor die and that of the substrate. Because of thermal gradients experienced by the semiconductor device during normal operation, the solder bumps which couple the die to the substrate experience significant stresses. These stresses can cause thermal fatigue and connection failures. Underfilling has been commonly used to overcome the thermal mismatch between the die and the substrate. This process involves inserting an encapsulation material, such as epoxy resin or other material, into the space between the semiconductor die and substrate after the die has been soldered to the substrate. In addition to being inserted into the space, surface tension produces a capillary action between the die and the substrate which pulls the epoxy into the space. This encapsulation material surrounds the solder bumps and mechanically couples the die and the substrate, thereby decreasing the stress in the solder joints to improve the lifetime of the semiconductor device.

The use of no-clean fluxes before underfilling, however, can result in voids in the encapsulation material. In accordance with prior art methods, as illustrated in FIG. 2, the distance between the semiconductor die 16 and the substrate 20 is very small, for example 3 mils or smaller, and any residue 22 left by the no-clean flux after reflow can act as a physical barrier to the encapsulation material 24 to the space 26 between the semiconductor die 16 and substrate 20. Also, flip-chips are characterized by relatively small pitches between solder joints, which further reduce the area into which the encapsulation material 24 can flow. Therefore, although this residue 22 may otherwise be benign, the blocking caused by the residue 22 can cause voids 28 in the encapsulation material. Voids 28 are a problem because any void 28 in the encapsulation material 24 adjacent a solder bump 12 reduces the stress-relieving properties of the encapsulation material 24. A similar type of problem also exists during underfilling between decoupling capacitors and a substrate. Accordingly, a need exists for an improved method of bonding using no-clean fluxes that reduces or eliminates the residues produced after the reflow process.

SUMMARY OF THE INVENTION

This and other needs are met by embodiments of the present invention which provide a method of attaching a component to a substrate using solder to form a semiconductor device, comprising applying flux to the semiconductor device; heating the solder and the flux in a furnace to bond the semiconductor die to the substrate; and controlling moisture content of an atmosphere surrounding the flux.

By controlling the moisture content of the atmosphere surrounding the flux, the present invention reduces the amount of flux residue formed during the reflow process, thereby avoiding the creation of voids in the encapsulation material of the semiconductor device and reducing ionic contamination that can compromise the reliability of the semiconductor device by leakage.

A further aspect of the present invention includes controlling the moisture during the heating step. Controlling the moisture can include the steps of measuring the moisture content in the furnace and providing a signal when the moisture content exceeds a threshold amount. In certain embodiments, the moisture content is maintained below 50 ppm. However, in other embodiments, the moisture content is preferably below 20 ppm.

Another aspect of the present invention is that the flux used during certain embodiments of this process is a no-clean flux. Also, the components being attached to the substrate can be flip-chip semiconductor dies or chip capacitors, which typically require an underfilling operation after reflow. The temperature of the furnace during reflow is from about 220° C. to about 380° C. in certain embodiments.

Additional advantages of the present invention will become readily apparent to those skilled in this art from the following detailed description, wherein only the preferred embodiment of the resent invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of residue formed on semiconductor devices after reflow. This is achieved in part, by controlling the moisture content in the atmosphere in the reflow furnace so as to prevent crosslinking of polymers in the no-clean flux. Advantageously, by controlling the moisture content, an additional cleaning step after reflow is not required and the formation of voids during any subsequent underfilling operation is prevented.

Figure 3:
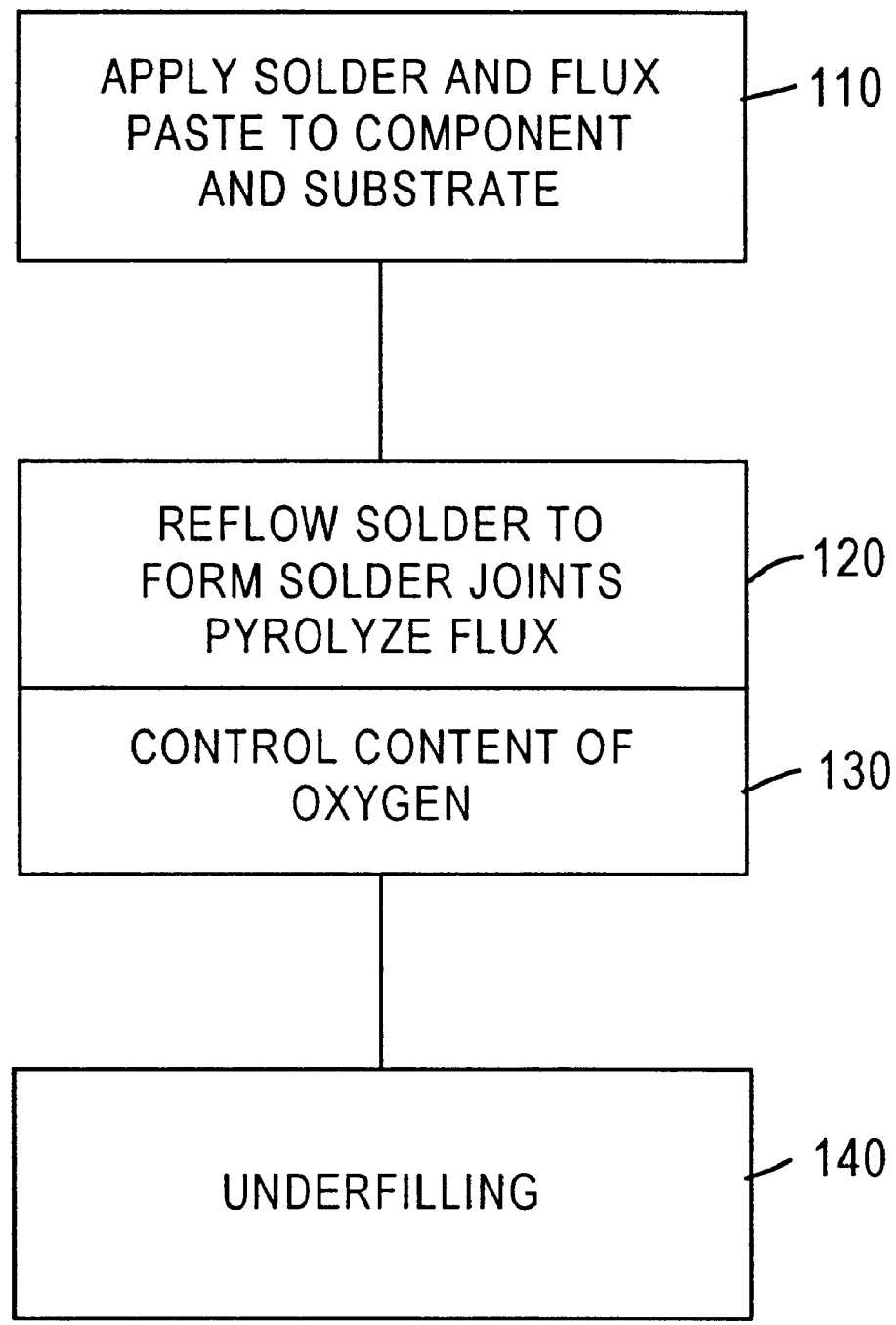
FIG. 3 is a flow chart of a method according to an embodiment of the present invention.

Referring now to the flow chart of FIG. 3, a method of manufacturing a semiconductor device by attaching at least one component to a substrate using solder according to a first embodiment of the invention is disclosed. At step 110, flux is applied to the component and/or substrate. In a preferred embodiment, the flux is a no-clean flux, and therefore advantageously eliminates the need for cleaning after reflow welding. A no-clean flux used with the present invention is available from Alpha Metals of Jersey City, N.J. Another example of a no-clean flux is TAC 10 from Indium Corporation of Utica, N.Y. Although the flux can be a flux that requires cleaning after reflow, the use of such a flux would negate the benefit of minimizing or eliminating the residue to be cleaned because if the semiconductor device is to be cleaned after reflow, little or no advantage is gained by reducing the residue generated during reflow.

Figure 1:
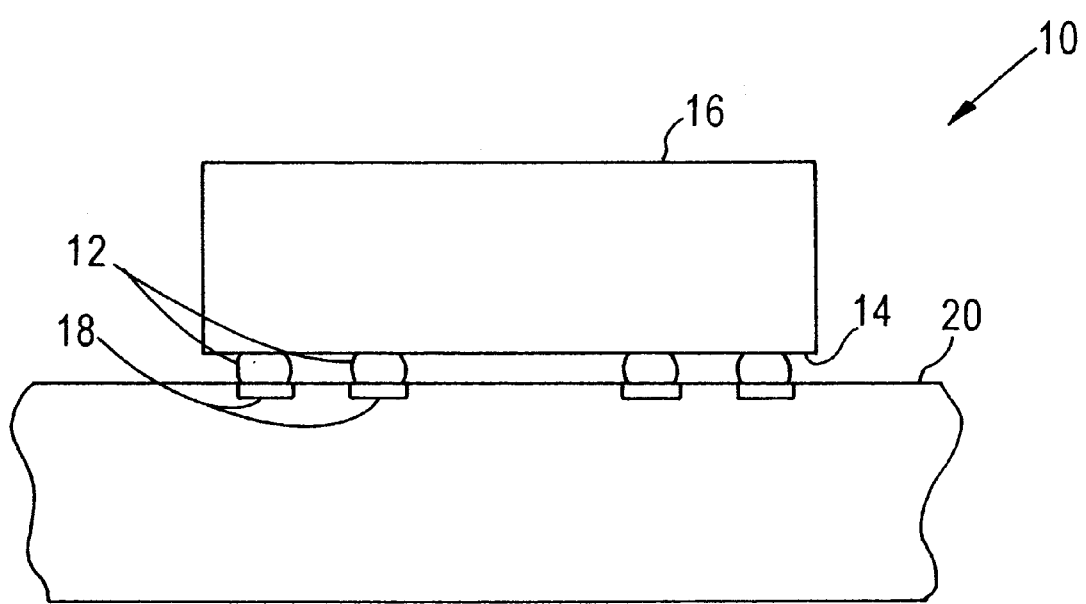
FIG. 1 is a side view of a flip-chip semiconductor device before reflow.

The component and the substrate are reflow welded together at step 120 to form the structure depicted in FIG. 1. Reflow welding refers to any of the various methods of applying heat to solder which results in the melting of the solder. The temperature of the furnace should therefore be sufficient to melt the solder but not hot enough to damage the components or substrate. Also, the temperature of the furnace should be sufficient enough to pyrolyze the flux. Pyrolyzation is the process by which a material undergoes chemical decomposition by heat, typically without oxidation. The melted solder subsequently solidifies after cooling and forms a solder joint between the component and the substrate. Although various methods of reflow welding exist, for example infrared, forced convection, and vapor phase, the invention is not limited as to a particular method.

In certain embodiments of the invention, the temperature range of the furnace is maintained from about 220° C. to about 380° C., most preferably below 270° C. for laminate packages and below 380° C. for ceramic packages. It should be noted however, that these temperature ranges can vary. As is known in art, for example, the low end of the temperature range can vary depending upon the melting temperature of the solder used and the pyrolyzation temperature of the flux used, and the high end of the temperature range can vary depending upon how susceptible a given component or substrate is to damage by heat.

In a preferred embodiment, the reflow welding is accomplished by heating the solder in a reducing or neutral atmosphere. A reducing or neutral atmosphere is used to prevent oxidation of metal during heating. Although the invention is not limited as to a particular reducing or neutral atmosphere, a reducing atmosphere used in current embodiments of the invention is nitrogen. In a typical manufacturing environment, the reducing gas supplied to the furnace is delivered via piping from a tank located outside of the plant. As the reducing gas flows through the piping, the reducing gas can pick up moisture from leaks or other sources in the piping.

Figure 4:
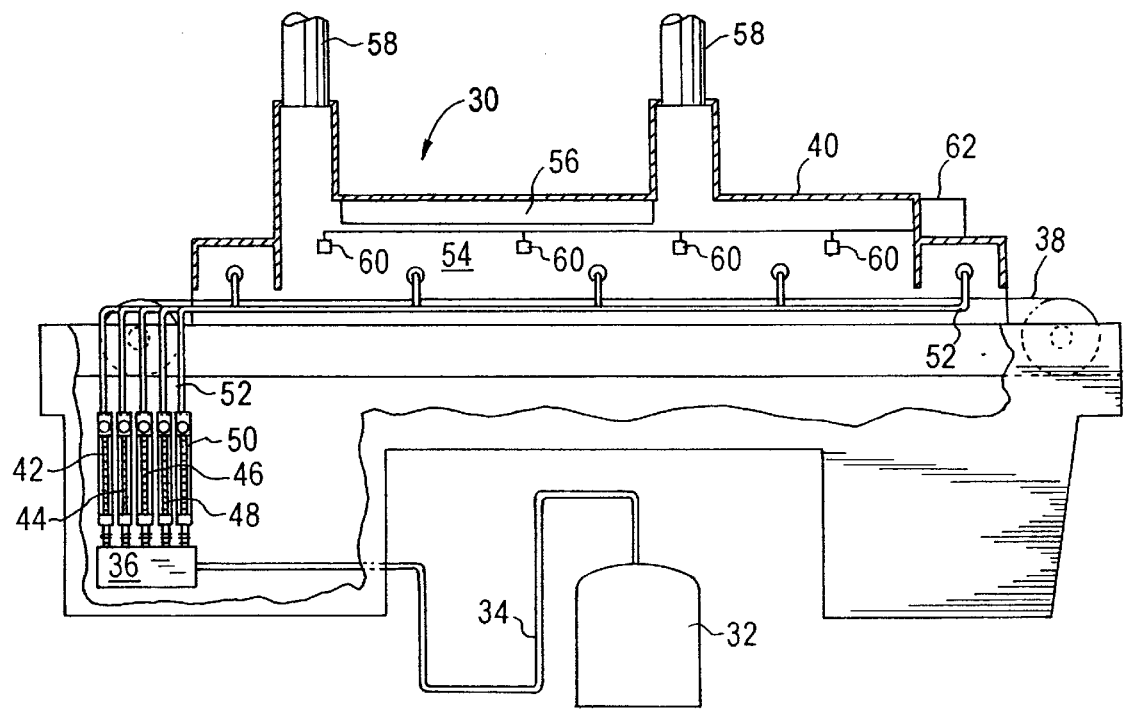
FIG. 4 is a reflow furnace according to another embodiment of the present invention.

With reference to FIG. 4, a reflow solder furnace 30 according to an embodiment of the invention is illustrated. The furnace 30 is supplied with a reducing gas, for example from a vessel 32 via a main line 34. This reducing gas is then introduced into a manifold block 36, which provides for discrete supply of the reducing gas through various conduits from the main line 34. Although five separate lines are shown emanating from the manifold block 36, it is understood that more or less distribution could be performed. The reducing gas then flows through flow control meters 42, 44, 46, 48 and 50, respectively, for each of the distribution lines 52 emanating from the flow control meters. Each of these distribution lines 52 penetrates the housing 40 of furnace 30 and enters the heating chamber 54.

The furnace 30 includes a conveyor belt 38 for supporting electronic components to be soldered. Within the chamber 54, the distribution lines 52 maintain the atmosphere while sources of heat, such as infrared radiant lamps 56, provide the necessary conditions for reflow welding. The furnace 30 can also include an exhaust 58 for removing pyrolyzed solder paste and excess reducing gas.

In certain embodiments of the invention, the furnace 30 includes moisture sensors 60 within the chamber 54 to measure the moisture content of the atmosphere. The moisture sensors 60 are connected to a controller 62, which monitors the moisture content in the atmosphere. When the moisture content within the chamber 54 reaches a predetermined level, the controller 62 can provide a signal to alert an operator. The operator can then take the steps necessary to correct the level of moisture in the chamber 54. These steps may include, but are not limited to, checking seals within the chamber 54 and the line 34 bringing the reducing gas into the furnace 30. Also, a portion of the atmosphere within the chamber 54 can be purged from the chamber 54, and an atmosphere having a lower moisture content can be introduced into the chamber 54.

Exposure of polymers in a no-clean flux to excessive amounts of moisture causes the formation of chemical links between reactive atoms in the molecular chain of the polymer, also known as crosslinking. Crosslinking makes the polymer more resistant to high temperatures; and as such, increases the pyrolyzation temperature of the polymer. This phenomenon results in increased residue after reflow as portions of the no-clean flux fail to pyrolyze. Although these residues can be pyrolyzed at higher temperatures, any increase in temperature during the reflow process is limited by the sensitivity of the components and the substrate to high temperatures.

Referring again to FIG. 3, at step 130, the moisture content of the atmosphere in the reflow furnace is controlled so as to minimize crosslinking in the no-clean flux, and therefore minimize or eliminate residue after reflow. Many different methods capable of controlling the moisture content in an atmosphere are known, and any method so capable is acceptable for use with the present invention. In a presently preferred embodiment of the invention, the moisture content is controlled by measuring the moisture content of the atmosphere and alerting an operator of the reflow furnace when the moisture content exceeds a set amount, or threshold.

The threshold amount is preferably set below a maximum desired amount of moisture. In this manner, when the operator is signaled that the moisture content exceeds the threshold amount, the operator can investigate and then correct the problem of excessive moisture in the atmosphere before the moisture content reaches the maximum desired amount of moisture. As such, stopping the process to purge the atmosphere is not required and the process can advantageously continue to run as the problem of increased moisture content is being corrected.

Problems with residue occur when the moisture content of the atmosphere exceeds 50 ppm. As such, it is desired to control the moisture content of the atmosphere to be below 50 ppm. However, in certain embodiments of the invention, the moisture content is controlled to be below 20 ppm, and this control is accomplished by monitoring the moisture content in the gas and alerting an operator when the moisture content exceeds a 10 ppm threshold amount.

Figure 2:
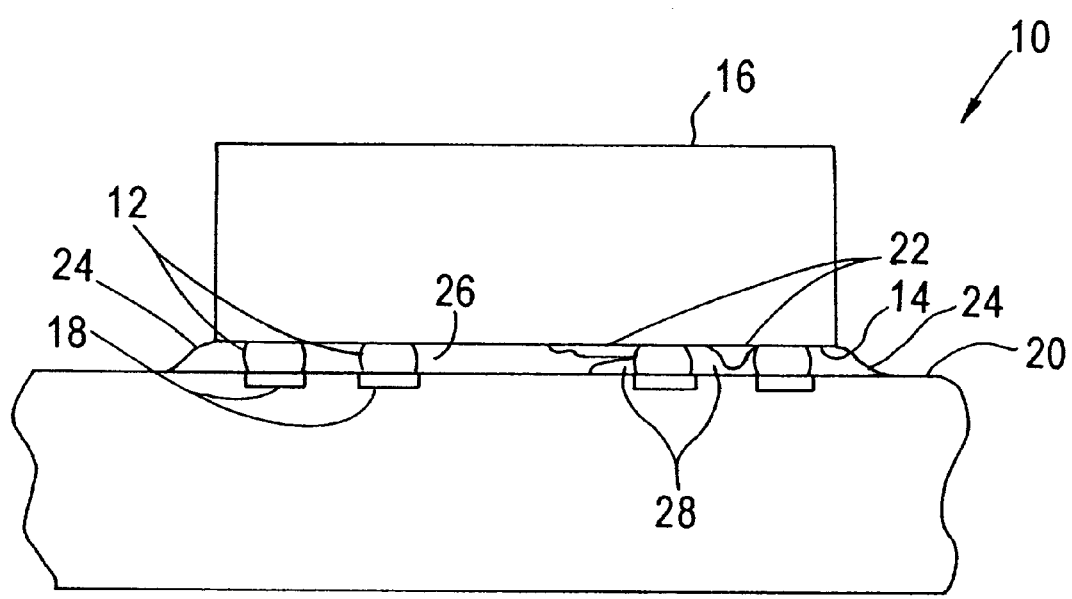
FIG. 2 is a side view of a flip-chip semiconductor device after reflow and underfilling in accordance with prior art methods.
Figure 5:
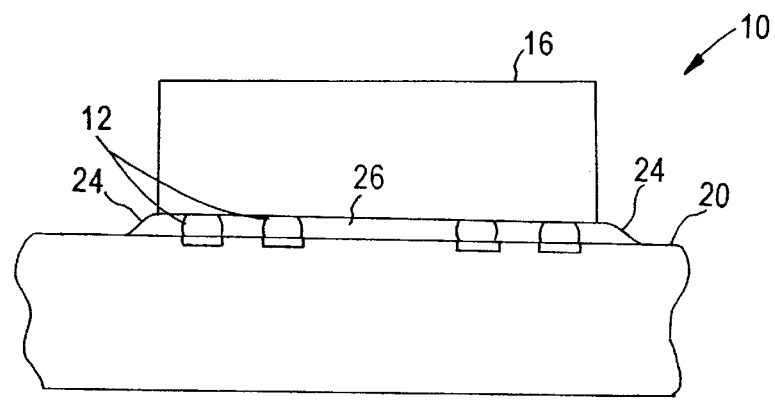
FIG. 5 is a side view of a flip-chip semiconductor device after reflow and underfilling in accordance with the method of FIG. 3.

In certain embodiments of the process according to the present invention, an underfilling operation of step 140 is performed after reflow. The result of such an underfill operation is depicted in FIG. 5. Underfilling is particularly advantageous when the substrate 20 is attached to a flip-chip or a decoupling capacitor and is accomplished by inserting an encapsulation material 24 into the space 26 between the component 16 and the substrate 20. Various types of methods of underfilling are known in the art, and this invention is not limited as to a particular type of underfilling. When compared to FIG. 2 of the prior art, it is apparent that the encapsulation material 24 has a reduced number, or no voids, in the encapsulation material 24. This reduction in voids is achieved by reducing or eliminating flux residue following the reflow process in the controlled moisture environment according to embodiments of the present invention.

By controlling the moisture content of the atmosphere surrounding the flux, a reduced amount of flux residue between the component and the substrate remains after reflow. Because this residue blocks the flow of encapsulation material into the space between the component and substrate thereby creating voids, reducing the amount of flux residue allows the free flow of encapsulation material into the space and prevents the formation of voids. When the encapsulation material surrounds the connections between the components and the substrate without voids, the encapsulation material decreases the stress on these connections, thereby strengthening the connections.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device by attaching a component to a substrate using solder, comprising the steps of:
    a) applying flux to one of the component and the substrate;
    b) heating the solder and the flux in a furnace with radiant heating to bond the component to the substrate; and
    c) controlling moisture content of an atmosphere in the furnace surrounding the flux to below about 50 ppm; wherein
        said moisture controlling step comprises the steps of measuring the moisture content in the furnace and providing a signal when the moisture content exceeds a threshold amount.

2. A method of manufacturing a semiconductor device according to claim 1, wherein said moisture controlling step occurs during said heating step.

3. A method of manufacturing a semiconductor device according to claim 1, wherein the moisture content is controlled to below about 20 ppm.

4. A method of manufacturing a semiconductor device according to claim 1, wherein the threshold amount is about 10 ppm.

5. A method of manufacturing a semiconductor device according to claim 1, wherein the flux is a no-clean flux.

6. A method of manufacturing a semiconductor device according to claim 1, wherein the component is a semiconductor die.

7. A method of manufacturing a semiconductor device according to claim 6, wherein the semiconductor die is a flip-chip.

8. A method of manufacturing a semiconductor device according to claim 1, wherein the component is a chip capacitor.

9. A method of manufacturing a semiconductor device according to claim 1, further comprising the step of underfilling between the component and the substrate.

10. A method of manufacturing a semiconductor device according to claim 1, wherein the furnace is at a temperature from about 220° C. to about 380° C.

11. A method of manufacturing a semiconductor device according to claim 10, wherein the furnace is at a temperature less than about 270° C.

12. A method of manufacturing a semiconductor device according to claim 11, wherein the semiconductor device includes a laminate package.

13. A method of manufacturing a semiconductor device according to claim 10, wherein semiconductor device includes a ceramic package.

14. A method of manufacturing a flip-chip semiconductor device by attaching a semiconductor die to a substrate using solder, comprising the steps of:

a) applying a no-clean flux to one of the semiconductor die and the substrate;

b) heating the solder and the flux in a furnace with radiant heating at a temperature from about 220° C. to about 380° C. to bond the semiconductor die to the substrate;

c) measuring moisture content of a reducing atmosphere in the furnace during said heating step;

d) providing a signal when the moisture content exceeds 10 ppm; and e) underfilling between the semiconductor die and the substrate after said heating step.

* * * * *

UNITED STATES PATENT AND TRADEMARK OFFICE
CERTIFICATE OF CORRECTION

PATENT NO. : 6,409,070 B1
DATED : June 25, 2002
INVENTOR(S) : Raj N. Master et al.

It is certified that error appears in the above-identified patent and that said Letters Patent is hereby corrected as shown below:

<u>Title page,</u>
Item [75], Inventors, change "Penag" to -- Penang --.

Signed and Sealed this

Twenty-seventh Day of August, 2002

*Attest:*

*Attesting Officer*

JAMES E. ROGAN
*Director of the United States Patent and Trademark Office*